US008809784B2

(12) United States Patent
Gooch et al.

(10) Patent No.: US 8,809,784 B2
(45) Date of Patent: Aug. 19, 2014

(54) INCIDENT RADIATION DETECTOR PACKAGING

(75) Inventors: Roland W. Gooch, Dallas, TX (US);
Stephen H. Black, Buellton, CA (US);
Thomas A. Kocian, Dallas, TX (US);
Buu Diep, Murphy, TX (US)

(73) Assignee: Raytheon Company, Waltham, MA (US)

( * ) Notice: Subject to any disclaimer, the term of this patent is extended or adjusted under 35 U.S.C. 154(b) by 336 days.

(21) Appl. No.: 13/275,635

(22) Filed: Oct. 18, 2011

(65) Prior Publication Data

US 2012/0096813 A1 Apr. 26, 2012

Related U.S. Application Data

(60) Provisional application No. 61/405,621, filed on Oct. 21, 2010.

(51) Int. Cl.
*G01J 5/00* (2006.01)
*G01J 5/04* (2006.01)
*H01L 27/146* (2006.01)
*H01L 23/10* (2006.01)
*B81B 7/00* (2006.01)

(52) U.S. Cl.
CPC ........... *H01L 27/14618* (2013.01); *H01L 23/10* (2013.01); *B81B 7/0077* (2013.01); *H01L 27/14683* (2013.01)
USPC ...... 250/338.1; 257/704; 438/106; 250/338.4

(58) Field of Classification Search
CPC ............. H01L 23/10; H01L 27/14618; H01L 27/14683; B81B 7/0077
USPC ................... 257/704, 433; 250/338.1, 338.4; 53/452; 438/6
See application file for complete search history.

(56) References Cited

U.S. PATENT DOCUMENTS

| 5,962,854 | A  | * | 10/1999 | Endo ............................. 250/349 |
| 6,586,831 | B2 | * | 7/2003 | Gooch et al. .................. 257/704 |
| 7,271,029 | B1 | * | 9/2007 | Tai ................................. 438/107 |
| 2006/0257785 | A1 | * | 11/2006 | Johnson ..................... 430/270.1 |
| 2007/0262407 | A1 | * | 11/2007 | Schimert et al. .............. 257/432 |
| 2008/0284002 | A1 | * | 11/2008 | Camacho et al. ............. 257/723 |
| 2011/0104844 | A1 | * | 5/2011 | Hsieh et al. ..................... 438/50 |

FOREIGN PATENT DOCUMENTS

| EP | 2065930 A1 | 6/2009 |
| WO | 2006062809 A2 | 6/2006 |

* cited by examiner

*Primary Examiner* — David Porta
*Assistant Examiner* — Yara B Green
(74) *Attorney, Agent, or Firm* — Lando & Anastasi, LLP

(57) ABSTRACT

In accordance with particular embodiments, a method for packaging an incident radiation detector includes depositing an opaque solder resistant material on a first surface of a transparent lid substrate configured to cover at least one detector. The method also includes forming at least one cavity in the lid substrate. The method further includes forming a first portion of at least one hermetic seal ring on the opaque solder resistant material. The first portion of each hermetic seal ring surrounds a perimeter of a corresponding cavity in the lid substrate. The method also includes aligning the first portion of the at least one hermetic seal ring with a second portion of the at least one hermetic seal ring. The method additionally includes bonding the first portion of the at least one hermetic seal ring with the second portion of the at least one hermetic seal ring with solder.

20 Claims, 3 Drawing Sheets

INCIDENT RADIATION DETECTOR PACKAGING

CROSS-REFERENCE TO RELATED APPLICATIONS

This application claims the benefit of priority under 35 U.S.C. §119(e) of U.S. Provisional Application Ser. No. 61/405,621, filed Oct. 21, 2010, and having a title of "Read-Out Integrated Circuit Device and Method."

BACKGROUND

A packaged focal plane array comprises a detector array, an associated reference detector array and read-out circuit, and a transmissive cover that seals the detector array, reference detector array and read-out circuit. The cover may be sealed via a seal ring. The seal ring may comprise two components, a first component on the transmissive cover and a second component on the substrate with the detector array, reference detector array, and read-out circuit. The two components may be aligned and soldered together to seal the two components together.

In some scenarios, one of the surfaces of the transmissive cover may include an infrared shield that is typically made of the same metal (e.g., gold) used to form the two components of the seal rings. Accordingly, the solder used to seal the infrared detector wets to the shield just as it does the seal rings. If the solder migrates out from the seal rings and wets to the shield, the shield may draw more solder onto the shield. This could deplete the solder from the seal, preventing a hermetic seal, and could potentially short-circuit the reference detector array. One common way of preventing the solder from wetting to the shield is to make the dimensions of each shield only slightly larger than the dimensions of the corresponding reference detector array. The seal ring is then designed large enough so that there is a sufficient gap between the seal ring and the shield to prevent solder extruded during bonding process from wetting to the shield.

SUMMARY OF THE DISCLOSURE

In accordance with particular embodiments, a method for packaging an incident radiation detector includes depositing an opaque solder resistant material on a first surface of a transparent lid substrate configured to cover at least one detector. The method also includes forming at least one cavity in the lid substrate. The method further includes forming a first portion of at least one hermetic seal ring on the opaque solder resistant material. The first portion of each hermetic seal ring surrounds a perimeter of a corresponding cavity in the lid substrate. The method also includes aligning the first portion of the at least one hermetic seal ring with a second portion of the at least one hermetic seal ring. The method additionally includes bonding the first portion of the at least one hermetic seal ring with the second portion of the at least one hermetic seal ring with solder.

Certain embodiments may provide one or more technical advantages. For example, a technical advantage of one embodiment may be that an opaque layer used to shield one or more reference detector arrays may be resistive to bonding with a bonding agent. This may reduce the chances of the bonding agent spreading onto the opaque layer and shorting the reference detector arrays or the detector arrays. This may allow the reference detector array to be positioned closer to the detector array which may allow for the packaged infrared detectors to be smaller. Other technical advantages will be readily apparent to one skilled in the art from the following figures, descriptions and claims. Moreover, while specific advantages have been enumerated above, various embodiments may include all, some, or none of the enumerated advantages.

BRIEF DESCRIPTION OF THE DRAWINGS

For a more complete understanding of particular embodiments and their advantages, reference is now made to the following description, taken in conjunction with the accompanying drawings, in which.

DETAILED DESCRIPTION OF THE DRAWINGS

Figure 1:
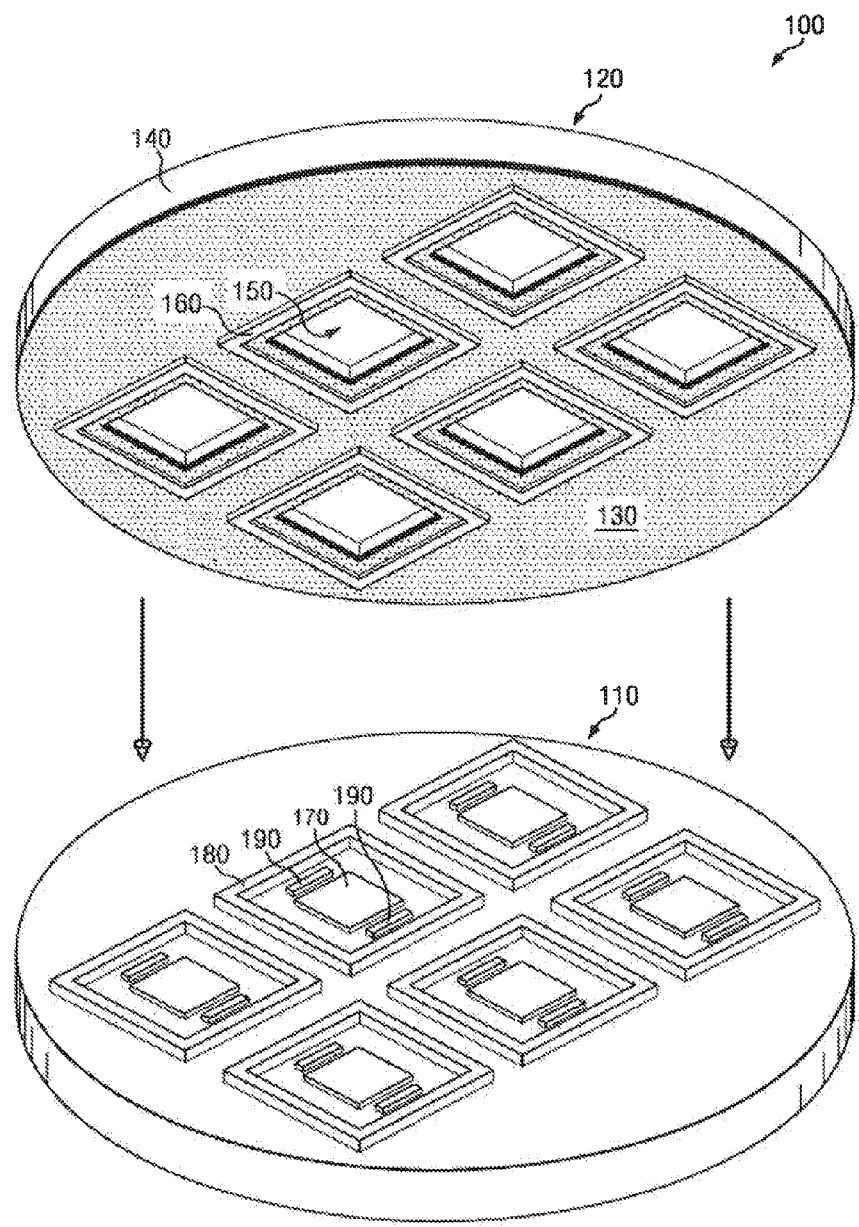
FIG. 1 depicts a perspective view of a lid wafer and a detector wafer, in accordance with particular embodiments.

FIG. 1 depicts a perspective view of a lid wafer and a detector wafer, in accordance with particular embodiments. Lid wafer 120 and detector wafer 110 may be two components of packaged infrared detector 100. Lid wafer 120 may function as a cover for a plurality of different detector arrays 170 and reference detector arrays 190 formed on the substrate of detector wafer 110. Lid wafer 120 and detector wafer 110 may be aligned such that lid seal rings 160 are aligned with detector seal rings 180. The aligned seal rings may be bonded together to seal the plurality of detector arrays 170 and their corresponding reference detector arrays 190 from the surrounding environment. The underside of lid wafer 120 comprises opaque layer 130. Opaque layer 130 may provide two features. First, it may not bond with the bonding agent used to seal the lid wafer and the detector wafer together. For example, if the bonding agent is solder, the solder may not wet to opaque layer 130. Second, opaque layer 130 may shield reference detectors arrays 190 from incident radiation being detected by detector arrays 170. Additional features and functions of various components are discussed below.

Detector wafer 110 may comprise a substrate (e.g., a silicon based substrate) with any suitable number of detector arrays 170 formed thereon. The number of detector arrays 170 may correspond to the number of cavities 150 in lid wafer 120.

Lid wafer 120 may comprise lid substrate 140 and opaque layer 130. Lid substrate 140 may be any suitable silicon (e.g., a Czochralski silicon wafer, a magnetically confined Czochralski silicon wafer, a floatzone silicon wafer) used to cover and seal detector arrays 170. In some embodiments, lid substrate 140 may include materials other than silicon. In some embodiments, lid substrate 140 may be transmissive to incident radiation in a variety of wavelengths, including both visible and infrared light (e.g., light between 3 micrometers and 14 micrometers). In some embodiments, lid wafer 120 may be between approximately 200 and 1500 micrometers thick. For example, in particular embodiments, lid wafer 120 may be approximately 725 micrometers thick. In some embodiments, lid wafer 120 may comprise additional layers. For example, lid wafer 120 may comprise a layer of float zone silicon bonded to a layer of silicon-on-insulator (SoI) material into which cavities 150 are formed.

Lid wafer 120 may comprise several cavities 150 formed in lid substrate 140. Each cavity 150 may correspond to a different detector array 170 and may be configured such that the corresponding detector array 170 is able to fit therein (e.g., the length, width and depth of cavity 150 may be based on the length, width, and height of detector array 170). The depth of cavities 150 may vary depending on the thickness of detector array 170 and/or a desired gap size between detector array 170 and lid substrate 140. While cavities 150 may extend over the corresponding detector array 170, they may not extend over reference detector arrays 190. This may allow opaque layer 130 to shield reference detector arrays 190 from light and/or incident radiation.

Cavities 150 may be formed in lid substrate 140 using any of a variety of techniques performed either before or after opaque layer 130 is deposited on lid substrate 140. For example, in some embodiments, opaque layer 130 may be deposited first, and then the same photolithography mask may be used to etch (e.g., using a deep reactive-ion etching technique) cavities 150 in both opaque layer 130 and lid substrate 140. As another example, in some embodiments, opaque layer 130 may be deposited after cavities 150 have been formed in lid substrate 140. In such embodiments, opaque layer may be deposited around cavities 150 or it may be deposited everywhere and then removed from cavities 150. Any other technique of depositing opaque layer 130 such that silicon layer 140 is exposed through cavities 150 may be used.

Opaque layer 130 may comprise an optically and/or thermally (e.g., infrared) blocking layer deposited on a surface of lid substrate 140. In certain embodiments, opaque layer 130 may restrict the flow of the bonding material used to bond lid wafer 120 and detector wafer 110 together. By preventing the bonding material from spreading beyond the seal ring, opaque layer 130 may allow for a smaller gap between detector seal ring 180 and reference detector array 190 and a smaller gap between reference detector array 190 and the edge of cavity 150. This may allow for smaller infrared detector designs (e.g., smaller die sizes) which may increase the die count of detector wafer 110. In some embodiments, opaque layer 130 may comprises titanium-tungsten (TiW). TiW may prevent the bonding material, such as solder (e.g., gold (80%)-tin (20%)), from wetting. TiW may also generally be opaque for blocking light and/or incident radiation (e.g., infrared radiation). This may allow opaque layer 130 to shield reference detector arrays 190 from light and/or incident radiation. In certain embodiments, opaque layer 130 may comprise titanium (e.g., titanium with a native oxide layer or any other processed oxide layer), titanium-nitride, or any other suitable material which may block incident radiation and which may resist bonding with a bonding agent.

Depending on the embodiment, opaque layer 130 may be deposited over lid substrate 140 (or a portion thereof) before cavities 150 are formed. In some embodiments, packets 150 may be formed in opaque layer 130 and lid substrate 140 using the same photolithography mask. This may reduce the number of manufacturing steps, as compared to using separate masks. The use of the same mask may also allow opaque layer 130 to be deposited right up to the edge of cavities 150. This may reduce the amount of internal reflections of light and/or incident radiation that is able to reach reference detector array 190.

In some embodiments, opaque layer 130 may have two or more inspection openings (not depicted). The inspection openings may provide a viewing window that may be used to visually check the alignment of lid seal rings 160 with detector seal rings 180 before bonding. The inspection openings may also be used to check the alignment after bonding. The inspection opening may be placed at various points around opaque layer 130. For example, in some embodiments they may be placed around the perimeter of opaque layer 130. As another example, they may be placed proximate to one, some, or all lid seal rings 160.

Lid seal rings 160 and detector seal rings 180 may be two components of a seal ring for a packaged infrared detector. The two components of the seal ring may form a closed loop of any shape that surrounds the components of the infrared detector. In the depicted embodiment, lid seal rings 160 surround cavities 150 and detector seal rings 180 surround detector arrays 170 and reference detector arrays 190. A bonding agent may be applied to one, or both, of the seal rings to form a seal between lid seal rings 160 and detector seal rings 180.

Both components of the seal ring may comprise multiple layers of different metals. For example, they may consist of titanium (Ti), platinum (Pt), nickel (Ni), and gold (Au). Other similar metals may be used and fewer or additional layers may be used. In some embodiments, lid seal ring 160 may be formed over opaque layer 130. In such an embodiment, opaque layer 130 may comprise one of the layers of lid seal ring 160. In certain embodiments, the top layer (e.g., the layer furthest from each respective wafer) may comprise gold, or other material to which the bonding agent readily bonds.

Detector arrays 170 may include any of a variety of different detectors, such as long-wave infrared detectors, short-wave infrared detectors, near infrared detectors, or any other detector capable of capturing images, thermal or otherwise. The type of detector arrays 170 used may depend on the intended application for the packaged infrared detector. For example, the packaged infrared detector may be used in video cameras, still image cameras, forward looking infrared systems (FLIRs), and the like. In particular embodiments, each detector array 170 may comprise a two dimensional array of individual detectors. Each individual detector may be independently responsive to incident radiation. The dimensions of the two dimensional array may vary depending on the intended application. For example, in some embodiments the two dimensional array may comprise individual detectors arranged in 640 columns by 480 rows. In some embodiments, detector arrays 170 may comprise microbolometer detector arrays. Each microbolometer may experience a change in resistance due to a change in temperature caused by incident radiation.

Reference detector arrays 190 may comprise an array of detectors similar in type to the array of detectors used in detector array 170. However, the number of detectors in reference detector arrays 190 may be less than the number of detectors used for detector arrays 170. Reference detector arrays 190 may be used to measure the ambient temperature within cavity 150 and/or of the substrate for detector array 170. These measurements may be used to calibrate or adjust the readings made by detector array 170. Opaque layer 130 may shield reference detector arrays 190 from the light and/or incident radiation being detected by detector array 170. This may provide reference detector arrays 190 with a more accurate measurement of the ambient temperature associated with the detectors of detector array 170.

Figure 2:
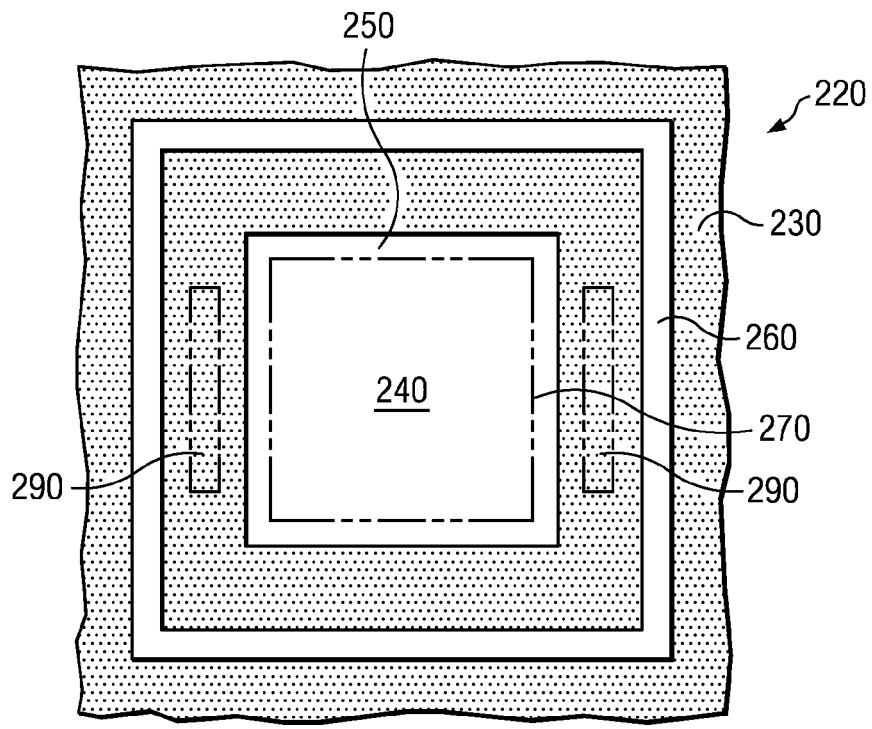
FIG. 2 depicts an overhead view of the underside of a lid of a single infrared detector, in accordance with particular embodiments.

FIG. 2 depicts an overhead view of the underside of a lid of a single infrared detector, in accordance with particular embodiments. The dotted lines are provided simply to show the relative location and alignment of reference detector arrays 290 and detector array 270 with the components of lid 220.

In lid 220, opaque layer 230 extends from the outer borders of lid substrate 240 to the edge of cavity 250. There is little or no gap between opaque layer 230 and cavity 250. This may provide an effective shield for reference detector arrays 290 from light and/or incident radiation. In addition, because there is no concern of the bonding agent adhering to opaque layer 230, seal ring 260 may be formed right on opaque layer 230 at a relatively short distance from reference detector array 290. This may allow for a smaller packaged incident radiation detector.

Deposited on opaque layer 230 is lid seal ring 260. Lid seal ring 260 forms a complete loop around cavity 250. Opaque layer 230 may be resistive to, or otherwise not bond with, a bonding agent used to seal lid 220 to a detector wafer (not depicted). For example, if the bonding agent comprises solder, the material of opaque layer 230 (e.g., TiW) may not readily allow the solder to wet to opaque layer 230. The surface tensions of the solder may help to keep the solder within the seal ring. This may allow for the distance between the inner edge of lid seal ring 260 and reference detector array 290 and the distance between the inner edge of lid seal ring 260 and the inner edge of opaque layer 230 to be reduced.

Figure 3:
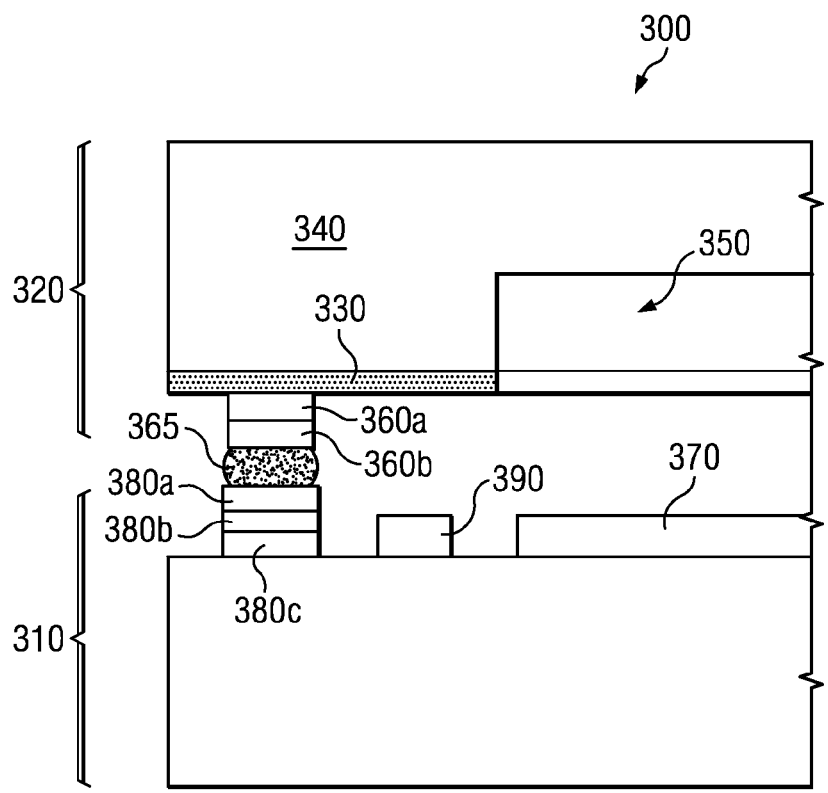
FIG. 3 depicts a side view of a portion of a packaged infrared detector, in accordance with particular embodiments.

FIG. 3 depicts a side view of a portion of a packaged infrared detector, in accordance with particular embodiments. Packaged infrared detector 300 comprises a portion of a finished (e.g., packaged) product in which lid wafer 320 has been sealed to detector wafer 310. Within the sealed cavity 350 are detector array 370 and reference detector arrays 390. In some embodiments, sealed cavity 350 may be hermetically sealed.

Lid substrate 340 may be substantially transmissive to light and/or incident radiation in any of a variety of different wavelengths depending on operational needs. This may allow the light and/or incident radiation to reach detector array 370. Cavity 350 may extend above detector array 370 but not above reference detector array 390. Opaque layer 330 may extend right to the edge of cavity 350. In some embodiments, this may be done by forming cavity 350 in both lid substrate 340 and opaque layer 330 using the same photolithography mask. Reference detector array 390 may be shielded from light and/or incident radiation by opaque layer 330.

Lid wafer 320 and detector wafer 310 may be sealed together with bonding agent 365 deposited between a lid seal ring and a detector seal ring. The lid seal ring may comprise opaque layer 330 and a stack of layered metals including layers 360a and 360b. In particular embodiments, opaque layer 330 may comprise titanium (e.g., titanium with a native oxide layer or any other processed oxide layer, TiW, titanium-nitride, etc.), layer 360a may comprise nickel and layer 360b may comprise gold. The detector seal ring may comprise a stack of layered metals including layers 380a, 380b, and 380c. In some embodiments, layer 380c may comprise titanium, layer 380b may comprise nickel, and layer 380a may comprise gold. Other materials, such as platinum, may be used as well. Layers 360b and 380a may both be made of the same material (e.g., gold). The material used may be one that readily bonds with bonding agent 365. For example, solder may readily wet to gold. Conversely, the material used for opaque layer 330 may be selected so that the bonding agent does not readily bond thereto. For example, solder may not readily wet to titanium-tungsten.

In certain embodiments, the materials used for bonding agent 365, layers 360b and 380a, and opaque layer 330 may chosen in concert such that the bonding agent 365 readily bonds to layers 360b and 380a but does not readily bond to opaque layer 330. For example, bonding agent 365 may comprise gold-tin solder (e.g., gold (80%)-tin (20%) solder), layers 360b and 380a may comprise gold, and opaque layer may comprise titanium-tungsten. Other material combinations may be used depending on operational or manufacturing needs. Because the bonding agent may readily bond with layers 360b and 380a, but not opaque layer 330, any bonding agent material that may spread out from the seal ring during bonding may retract back into the seal due to the resistance to wetting of opaque layer 330 relative to layers 360b and 380a.

Thus far, several different embodiments and features have been presented. Particular embodiments may combine one or more of these features depending on operational needs and/or component limitations. This may allow for great adaptability of the packaged infrared detector to the needs of various organizations and users. Some embodiments may include additional features. More over, while the focus has been on infrared detectors, other devices such as micro-electro-mechanical systems (MEMS) devices, may comprise similar features (e.g., the use of a layer that is resistive to bonding with a bonding agent).

Figure 4:
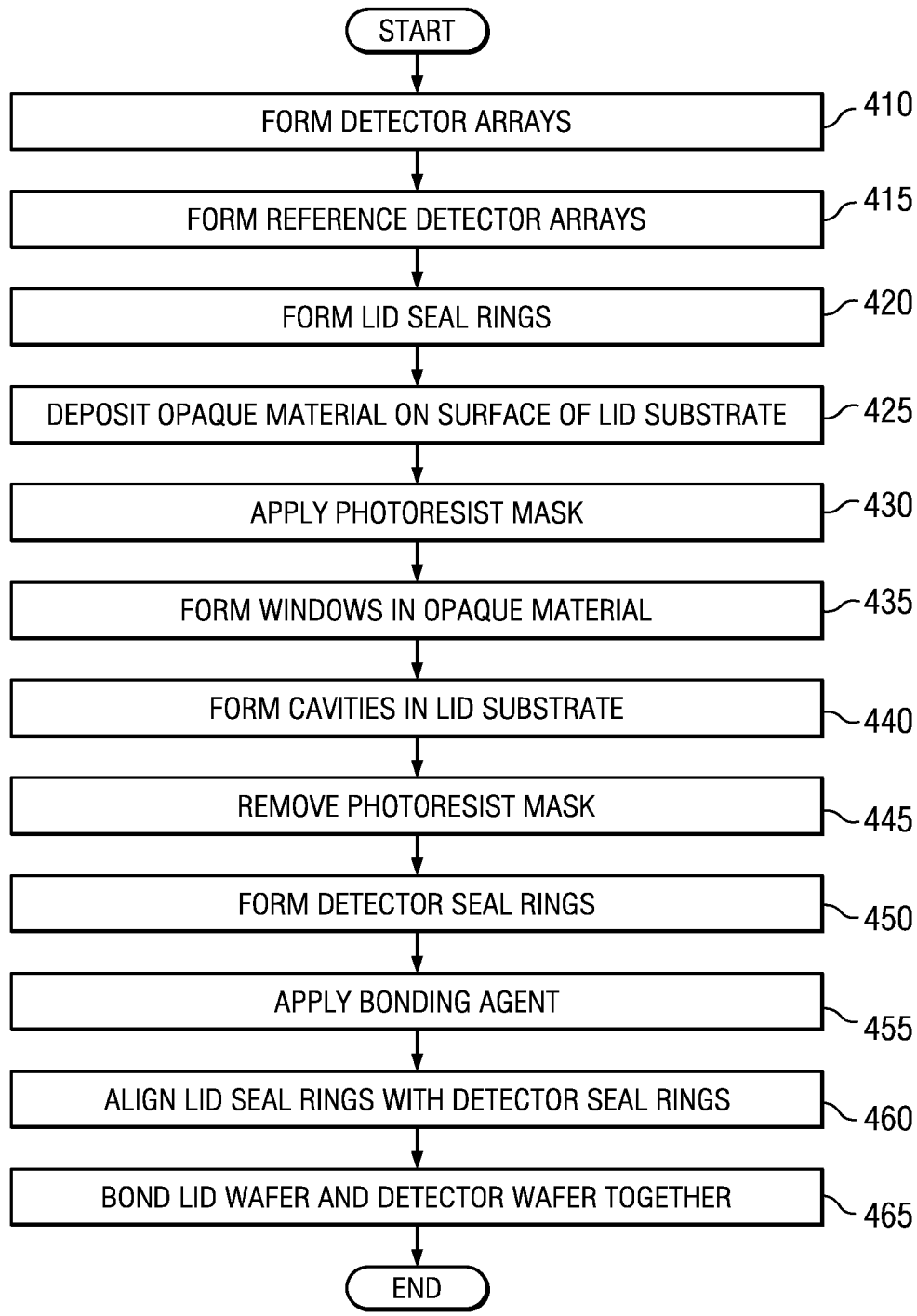
FIG. 4 depicts a method for packaging an infrared detector, in accordance with particular embodiments.

FIG. 4 depicts a method for packaging an infrared detector, in accordance with particular embodiments. The method begins at step 410 with the formation of a plurality of detector arrays. The plurality of detector arrays may be independent detector arrays formed on a single substrate of a detector wafer. Each detector array may comprise a two-dimensional array of individual detectors. For example, the individual detectors may comprise microbolometers. Particular embodiments may include other types of infrared detectors, or other types of detectors.

At step 415 a plurality of reference detector arrays are formed. The reference detector arrays may be functionally similar to the detector arrays formed at step 410. However, the number of detectors within each reference detector array may be less than the number of detectors in the detector arrays and the reference detector arrays may be shielded from light and/or incident radiation. The reference detector arrays may be configured to provide an indication of the ambient temperature (e.g., the temperature of the substrate on which the detector array is formed). Each detector array formed at step 410 may include at least one, or in some instances at least two, reference detector arrays formed at step 415.

At step 420 a plurality of detector seal rings are formed. Each detector seal ring may surround a corresponding detector array and its associated reference detector arrays. For example, if the detector wafer comprises twenty detector arrays, then twenty detector seal rings may be formed at step 420. Each seal ring may be slightly larger than the size of the detector array and its associated reference detectors. The detector seal rings may be one component of a hermetic seal that may be used to hermetically seal the detector array and its associated reference detector arrays within a cavity. In some embodiments, the cavity may be in a state of vacuum. In some embodiments, the detector seal rings may comprise a stack of multiple different materials. For example, the stack may include titanium nickel gold, wherein the gold layer is at the top of the stack (e.g., furthest away from the substrate on which the detector array is formed). In some embodiments, steps 410 through 420 may generally be considered as forming a detector wafer.

At step 425 an opaque material is deposited on the surface of a lid substrate. The lid substrate may be a thermally and/or optically transparent silicon wafer. In some embodiments, the lid substrate may comprise materials other than silicon. The opaque material may be configured to block light and/or incident radiation. The opaque material may be resistive to bonding with a bonding agent used at step 455 (discussed below). For example, the opaque material may be a metal such as titanium, titanium-tungsten, or titanium nitride, to which melted solder does not wet.

At step 430 a photoresist mask is applied to the opaque layer. The photoresist mask may define a pattern that is to be etched into both the lid substrate and the opaque material. The pattern may include a plurality of windows in the opaque material and a plurality of cavities in the lid substrate. The number of windows and cavities may correspond to the number of detector arrays formed at step 410.

At step 435 windows are formed in the opaque material and at step 440 cavities are formed in the lid substrate. In forming the windows at step 435 a portion of the opaque material may be removed. Similarly, in forming the cavities in the lid substrate, a portion of the lid substrate may be removed. The cavities may extend through a portion of the total thickness of the lid substrate leaving at least some of the lid substrate to cover the detector array. Both the windows in the opaque material and the cavities in the lid substrate may be formed from the same photoresist mask. This may help to ensure that at least two of the dimensions of both the window in the opaque material and the cavity in the lid substrate are substantially similar and that the opaque material extends right up to the edge of the cavity in the lid substrate. The use of the same mask may also reduce the number of steps needed to manufacture the packaged infrared detector.

Both the windows in the opaque material and the cavities in the lid substrate may be substantially aligned with the infrared detector that was formed at step 415. This may allow incident radiation (e.g., infrared radiation) to reach the detector array. Because the window and cavity do not extend out over the reference detector arrays formed at step 415, the opaque material that is remaining after the windows are formed may be used to block the incident radiation from reaching the reference detector arrays. Once the cavities have been formed the photoresist mask is removed at step 445.

At step 450 a plurality of lid seal rings are formed. The lid seal rings may comprise a similar stack of metal as the detector seal rings formed at step 420. For example, the stack of metal may include titanium, nickel, and gold. In some embodiments, the bottom layer of the stack may comprise the opaque layer. For example, if the opaque layer is TiW, the bottom layer of the lid seal ring may be TiW. The remainder of the stack may be nickel and gold. Each lid seal ring may surround, but be slightly larger than, the cavity in the lid substrate and the window in the opaque material. The gap between the cavity in the lid substrate and the edge of the lid seal ring may be significantly less than in a traditionally covered detector array manufactured and packaged using traditional techniques. The shape of the lid seal rings may correspond to the shape and size of the detector seal rings formed at step 420. In some embodiments, steps 425 through 450 may generally be considered as forming a lid wafer.

At step 455 a bonding agent is applied. The bonding agent may be applied to either the lid seal rings, the detector seal rings, or both. The bonding agent may be any type of bonding material used to seal the detector wafer to the lid wafer. For example, the bonding agent may be solder, such as gold-tin solder (e.g., gold (80%)-tin (20%) solder). In certain embodiments, the bonding agent may be such that it adheres to the detector seal rings and lid seal rings, but does not adhere to, or bond with, the opaque material. For example, in the case of solder, the bonding agent may readily wet to the detector seal rings and the lid seal rings but may not wet to the opaque material.

At step 460 the detector seal rings are aligned with the lid seal rings. In aligning the detector seal rings and the lid seal rings, the windows in the opaque material and the cavities in the lid substrate may be aligned with the detector arrays formed at step 410. As mentioned above, this may allow for a thermally and/or optically transmissive window to cover the detector array. This may provide protection for the detector array while still allowing light and/or incident radiation to reach the detector array. Furthermore, because the opaque layer covers the lid wafer, except for the cavity portions, the opaque material may block light and/or incident radiation from reaching the reference detector arrays.

At step 465 the lid wafer is bonded with the detector wafer. This may create a sealed volume within which the detector array is sealed. In some embodiments in which solder is used as the bonding agent, step 465 may comprise melting the solder so that is in a liquid state. In the liquid state, the solder may spread onto the opaque material. However, because the opaque material does not bond with the bonding agent (e.g., the solder may not readily wet to the opaque material), as the solder begins to cool, it may draw back within the seal ring thereby decreasing, or eliminating, the spread of solder beyond the seal ring. This may allow the seal ring to be closer to the reference detector arrays and/or the detector arrays.

Some of the steps illustrated in FIG. 4 may be combined, modified or deleted where appropriate, and additional steps may also be added to the flowchart. Additionally, steps may be performed in any suitable order without departing from the scope of particular embodiments. The steps depicted in FIG. 4 are just an example of the steps performed for a particular embodiment, other embodiments may use different steps arranged in a different order. For example, in some embodiments, the cavity may be formed in the lid substrate before the opaque material is deposited on the surface of the lid substrate. In such an embodiment, step 440 (where the cavity is formed in the lid substrate) may be performed before step 425 (when the opaque material is deposited on the surface of the lid substrate). Furthermore, in such an embodiment, the deposited opaque material may only be deposited on the portion of the lid substrate that forms the cavity. As another example, in some embodiments, the method may include receiving a detector wafer that has already been formed. In such a scenario, steps 410, 415, and/or 420 may be replaced with a single step of receiving a detector wafer.

Although particular embodiments have been described in detail, it should be understood that various other changes, substitutions, combinations, and alterations may be made hereto without departing from the spirit and scope of the disclosure. It is intended that particular embodiments encompass all such changes, substitutions, variations, alterations, and modifications as falling within the spirit and scope of the appended claims. For example, although an embodiment has been described with reference to a number of elements included in a packaged infrared detector, such as cavities, detector arrays, reference detector arrays, seal rings, opaque layers, and bonding agents, these elements may be combined, rearranged, modified or re-positioned in order to accommodate particular detection or manufacturing needs. In addition, any of these elements may be provided as integrated internal or separate external components to each other where appropriate. Particular embodiments contemplate great flexibility in the arrangement of these elements as well as their internal components.

What is claimed is:
1. A method for packaging an incident radiation detector, comprising:
    forming a detector wafer, wherein forming the detector wafer comprises:
        forming a plurality of detector arrays on a detector substrate, each detector array comprising a plurality of individual detectors;

forming a plurality of reference detector arrays on the detector substrate, each detector array having at least one reference detector array associated therewith;

forming a plurality of detector seal rings on the detector substrate, each detector seal ring surrounding at least one detector array and at least one reference detector array;

forming a lid wafer, wherein forming the lid wafer comprises:

depositing an opaque material on a first surface of a lid substrate, the opaque material having reduced bonding with a bonding agent;

forming a plurality of windows in the opaque material;

forming a plurality of cavities in the lid substrate;

forming a plurality of lid seal rings partially formed in the opaque material, wherein the opaque material comprises at least one layer of each lid seal ring of the plurality of lid seal rings, each lid seal ring surrounding at least one window in the opaque material;

applying a bonding agent to at least one of the plurality of detector seal rings or the plurality of lid seal rings;

aligning the plurality of detector seal rings with the plurality of lid seal rings; and bonding the lid wafer and the detector wafer together with the bonding agent.

2. The method of claim 1, wherein a first dimension and a second dimension of each of the plurality of windows in the opaque material is substantially similar to a first dimension and a second dimension of each cavity of the plurality of cavities in the lid substrate.

3. The method of claim 1, wherein the bonding agent comprises solder.

4. The method of claim 1, wherein the opaque material comprises titanium-tungsten.

5. A method for packaging an incident radiation detector, comprising:

depositing an opaque solder resistant material on a first surface of a transparent lid substrate configured to cover at least one detector;

forming at least one cavity in the lid substrate;

forming a first portion of at least one hermetic seal ring partially formed in the opaque solder resistant material, wherein the opaque solder resistant material comprises at least one layer of the at least one hermetic seal ring, the first portion of the at least one hermetic seal ring surrounding a perimeter of a corresponding cavity in the lid substrate;

aligning the first portion of the at least one hermetic seal ring with a second portion of the at least one hermetic seal ring; and bonding the first portion of the at least one hermetic seal ring with the second portion of the at least one hermetic seal ring with solder.

6. The method of claim 5, further comprising forming at least one window in the opaque solder resistant material, the window removing a portion of the opaque solder resistant material corresponding to each detector, a remaining portion of the opaque solder resistant material covering at least one reference detector associated with each detector.

7. The method of claim 5, wherein forming the cavity in the lid substrate comprises:

applying a photoresist mask;

forming a window in the opaque solder resistant material based on the photoresist mask;

forming the cavity in the lid substrate based on the photoresist mask; and removing the photoresist mask.

8. The method of claim 5, wherein the cavity is formed in the lid substrate before depositing the opaque solder resistant material on a first surface of a transparent lid substrate configured to cover a detector.

9. The method of claim 5, wherein depositing an opaque solder resistant material on a first surface of a transparent lid substrate comprises depositing an opaque solder resistant material comprising titanium-tungsten on a first surface of the transparent lid substrate.

10. The method of claim 5, wherein the detector comprises an array of microbolometer detectors.

11. The method of claim 5, wherein forming the first portion of the at least one hermetic seal ring comprises depositing at least two layers of metal, at least one of the two layers comprising gold.

12. The method of claim 5, wherein the second portion of the at least one hermetic seal ring is coupled to a substrate comprising the detector.

13. A packaged incident radiation detector, comprising:

a transparent silicon layer covering a detector and at least one reference detector;

an opaque layer coupled to the silicon layer and covering the at last one reference detector, the opaque layer including an opening that exposes the detector;

a lid seal ring partially formed in and coupled to the opaque layer, wherein the opaque layer comprises at least one layer of the lid seal ring;

a detector substrate comprising the detector and the at least one reference detector;

a detector seal ring coupled to the detector substrate; and a bonding layer configured to bond the lid seal ring and the detector seal ring together, the bonding layer comprising a bonding agent configured to not bond with the opaque layer.

14. The packaged incident radiation detector of claim 13, further comprising:

a cavity in the transparent silicon layer, the cavity positioned in the silicon layer to align with the detector; and a window in the opaque layer, the window substantially aligned with the cavity in the silicon layer and configured to expose the detector.

15. The packaged incident radiation detector of claim 13, further comprising a plurality of inspection windows formed in the opaque layer.

16. The packaged incident radiation detector of claim 15, wherein the cavity in the transparent silicon layer and the window in the opaque layer comprise at least two substantially similar dimensions.

17. The packaged incident radiation detector of claim of 13, wherein the bonding agent comprises solder configured to not wet on the opaque layer.

18. The packaged incident radiation detector of claim 13, wherein the opaque layer comprises titanium-tungsten.

19. The packaged incident radiation detector of claim 13, wherein the detector comprises an array of microbolometer detectors.

20. The packaged incident radiation detector of claim 13, wherein:

the lid seal ring comprises at least two layers of metal, at least one of the two layers comprising gold; and the detector seal ring comprises at least two layers of metal, at least one of the two layers comprising gold.

* * * * *